US010361537B2

(12) United States Patent
Gudaitis et al.

(10) Patent No.: US 10,361,537 B2
(45) Date of Patent: Jul. 23, 2019

(54) DYNAMIC SUPPLY VOLTAGE CONTROL CIRCUIT FOR LASER DIODE

(71) Applicant: MICROSOFT TECHNOLOGY LICENSING, LLC, Redmond, WA (US)

(72) Inventors: Algird Michael Gudaitis, Fall City, WA (US); Niranjan Puttaswamy, San Jose, CA (US); Sheethal Somesh Nayak, San Francisco, CA (US); Raymond Kirk Price, Redmond, WA (US); John Allen Tardif, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/820,356

(22) Filed: Nov. 21, 2017

(65) Prior Publication Data

US 2019/0157839 A1 May 23, 2019

Related U.S. Application Data

(63) Continuation-in-part of application No. 15/791,329, filed on Oct. 23, 2017.

(51) Int. Cl.

*H01S 5/068* (2006.01)
*H01S 5/0683* (2006.01)
(Continued)

(52) U.S. Cl.

CPC ........ *H01S 5/06808* (2013.01); *H01S 5/0683* (2013.01); *H04N 9/3155* (2013.01);
(Continued)

(58) Field of Classification Search

CPC .................................................. H01S 5/06808
See application file for complete search history.

(56) References Cited

U.S. PATENT DOCUMENTS

| | | | |
|---|---|---|---|
| 5,990,923 | A | 11/1999 | Morrison |
| 6,697,402 | B2 | 2/2004 | Crawford |

(Continued)

FOREIGN PATENT DOCUMENTS

| | | | |
|---|---|---|---|
| CN | 202221868 | U | 5/2012 |
| CN | 202258260 | U | 5/2012 |
| WO | 2016128716 | A1 | 8/2016 |

OTHER PUBLICATIONS

"Four-String, White LED Driver for LCD Backlight Applications", Retrieved From <<http://www.analog.com/media/en/technical-documentation/data-sheets/ADD5207.pdf>>, 2009, 17 Pages.

(Continued)

*Primary Examiner* — Tod T Van Roy
(74) *Attorney, Agent, or Firm* — Newport IP, LLC; Scott Y. Shigeta

(57) ABSTRACT

A system for dynamically adjusting a bias voltage for a laser diode or a light emitting diode is provided. An output voltage of the laser diode is measured and a level of a supply voltage applied to the laser diode is adjusted to change the bias voltage to the laser diode to manage power usage and avoid saturation of the laser diode. Also, a junction temperature of a laser diode may be estimated by mapping a measured output voltage and known current to device characteristic data based on temperature and the supply voltage adjusted in order to bias the laser diode to compensate for a temperature change. Further, data indicating an intensity level of data to be rendered by the laser diode is used to adjust the second supply voltage to bias the laser diode in advance of rendering the data.

20 Claims, 16 Drawing Sheets

(51) Int. Cl.
*H04N 9/31* (2006.01)
*H05B 33/08* (2006.01)
*G02B 27/01* (2006.01)

(52) U.S. Cl.
CPC ....... *H04N 9/3161* (2013.01); *H05B 33/0887* (2013.01); *G02B 27/0172* (2013.01)

(56) References Cited

U.S. PATENT DOCUMENTS 7,376,354 B2 5/2008 White
7,812,666 B2 10/2010 Chieng et al.
7,978,743 B2 7/2011 Deppe et al.
8,125,704 B2 2/2012 Mielke et al.
8,207,474 B2 6/2012 Dane et al.
8,743,455 B2 6/2014 Gusev et al.
8,767,023 B2 7/2014 Sakai et al.
9,130,344 B2 9/2015 Stadler et al.
9,160,140 B2 10/2015 Gusev et al.
9,531,931 B2 12/2016 Patel et al.
2004/0202216 A1* 10/2004 Fairgrieve ............... H01S 5/042 372/38.07
2005/0168564 A1 8/2005 Kawaguchi et al.
2008/0106493 A1 5/2008 Lach et al.
2008/0225915 A1* 9/2008 McCormack ........ G11B 7/1263 372/38.02
2009/0245302 A1 10/2009 Baird et al.
2011/0241549 A1 10/2011 Wootton
2012/0081009 A1 4/2012 Shteynberg et al.
2014/0185643 A1 7/2014 McComb et al.
2015/0378151 A1 12/2015 Nishioka
2016/0073069 A1 3/2016 Xue
2016/0149376 A1* 5/2016 Ritter .................... H02M 3/156 372/38.07
2016/0233643 A1* 8/2016 Fujimoto ............ H01S 5/06804
2017/0005465 A1 1/2017 Wyland et al.
2017/0005574 A1 1/2017 Wyland
2017/0054272 A1 2/2017 Chiu et al.
2017/0118452 A1 4/2017 Ogi et al.
2017/0214893 A1* 7/2017 Naftali ................. H04N 9/3155
2019/0123512 A1 4/2019 Gudaitis et al.

OTHER PUBLICATIONS

"Integrated, 2-Channel, High-Brightness LED Driver with High-Voltage Boost and SEPIC Controller", Retrieved From <<https://datasheets.maximintegrated.com/en/ds/MAX16838B.pdf>>, Retrieved on: Jun. 21, 2017, pp. 1-21.

"Methods of Controlling Laser Drivers: POTs and DACs", Retrieved From <<https://www.maximintegrated.com/en/app-notes/index.mvp/id/1010>>, Mar. 26, 2002, 3 Pages.

"Pulsed Laser Diodes—PGA —PGEW Series", Retrieved From <<https://www.pacer.co.uk/Assets/User/1779-Lasers_for_LRF_pdf>>, Retrieved on: Jun. 21, 2017, pp. 19-21.

Holmgren, et al., "Scanned Laser Displays for Head Mounted Displays", Retrieved From <<http://www.cs.unc.edu/techreports/92-029.pdf>>, Apr. 1990, pp. 1-16.

"International Search Report and Written Opinion Issued in PCT Application No. PCT/US2018/055763", dated Feb. 5, 2019, 15 Pages.

* cited by examiner

DYNAMIC SUPPLY VOLTAGE CONTROL CIRCUIT FOR LASER DIODE

This application claims priority to U.S. patent application Ser. No. 15/791,329, filed Oct. 23, 2017, entitled LASER DIODE PRIMING TO REDUCE LATENCY. The entire disclosures of the afore-mentioned patent applications are incorporated herein by reference.

BACKGROUND

A laser diode is an electro-optical device in which an intrinsically-doped, direct-bandgap semiconductor zone separates opposing p- and n-doped zones. Under forward bias, the p- and n-doped zones inject charge carriers into the intrinsically-doped zone, which is configured as a laser cavity. When electrical current is injected into the diode laser, an inverted population of electrons and holes accumulate within the quantum well of the laser diode. Some of the accumulated charge carriers may recombine by stimulated photon emission, causing a coherent beam to emerge from the laser cavity. A laser diode may be used in electronic-display applications.

In some laser display applications, it is desirable to have low power usage in order to enable long life battery operation. The threshold current requirement of the laser diode typically dictates the majority of the energy loss in the lasers and adjusting the bias of the laser diode can reduce power usage. Reducing the bias voltage will reduce the power usage. However, a lower bias voltage increases the likelihood of saturating the laser diode while outputting a display signal.

Also, the voltage-current characteristics for laser diodes can vary greatly with temperature. The biasing voltage for the laser diode may be adjusted to compensate for the effects of temperature based on an estimate of the junction temperature of the diode. However, conventional approaches to temperature compensation are often inaccurate, slow, or both. The disclosure made herein is presented with respect to these and other considerations.

SUMMARY

Circuits and methods for dynamically adjusting a bias voltage for a light emitting diode are provided and described herein. In some configurations involving management of power and dynamic range, a system can include a voltage sensor that is coupled to a first terminal of a laser diode to sample and measure an output voltage at the first terminal of the laser diode. A controller receives the voltage measurement from the voltage sensor and outputs a voltage control signal to a voltage supply that causes the voltage supply to change the level of a second supply voltage applied to a second terminal of the laser diode. The controller adjusts the second supply voltage to adjust a bias voltage to the laser diode to manage power usage and avoid saturation of the laser diode.

The laser slope efficiency and threshold current of visible light laser diodes is temperature dependent, resulting in laser output power that is heavily dependent on laser diode junction temperature. In some configurations involving temperature compensation of the laser output power, a measured output voltage and known current are used to estimate a junction temperature of a laser diode based on mapping these values to device characteristic data based on temperature. In such configurations, a current is known for the laser diode, e.g. the drive current applied to the laser diode by a current source, and the output voltage at the laser diode is measured, e.g. the voltage at the first terminal of the laser diode measured by the voltage sensor. Device characteristic data for different junction temperatures is stored as calibration data. In a single ended approach, the controller maps the known current, e.g. the current output by current source biased well below the threshold current, and the measured operating voltage to the calibration data in order to estimate the junction temperature of the laser diode. Based on the estimated junction temperature, the controller adjusts the second supply voltage in order to provide sufficient drive current and voltage for the display content, taking into account the temperature-dependent laser diode threshold current, slope efficiency, and forward voltage characteristics.

In a differential approach to junction temperature estimation, the output voltage is measured at two known currents and the measured output voltage values and known currents are used to determine a slope of the device characteristic. The slope is then mapped to the device characteristic data for different junction temperatures stored as calibration data 443 to estimate the junction temperature of the laser diode.

In some configurations involving feed forward bias voltage adjustment, the characteristics of the incoming video data to be rendered using the laser diode are known and provided to the laser display system before the video data is rendered. The activity or illumination level in an incoming video frame or sequence of frames may be represented in video characteristic data, such as a histogram that is input to the controller. The controller utilizes the video characteristic data as well as the estimated laser junction temperature to adjust the bias voltage for the laser diode in anticipation of the effect of the incoming video data on the laser diode.

It should be appreciated that the above-described subject matter may also be implemented as part of an apparatus, system, or as part of an article of manufacture. These and various other features will be apparent from a reading of the following Detailed Description and a review of the associated drawings.

This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1:
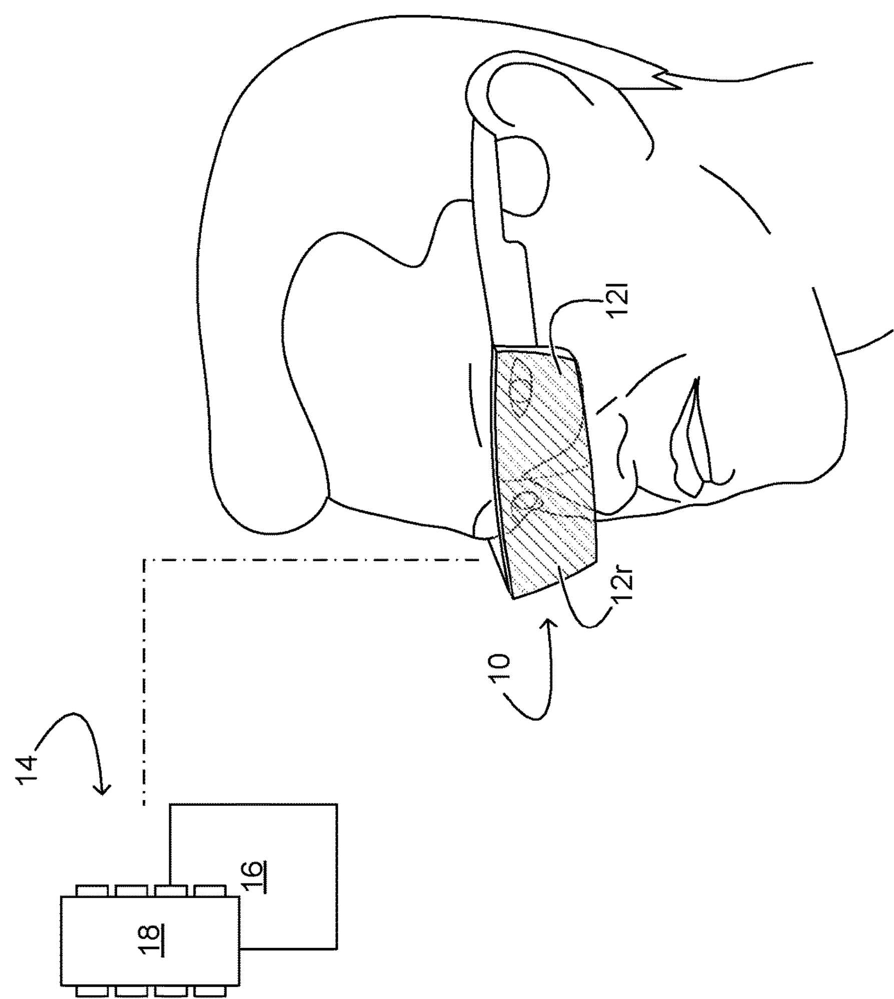
FIG. 1 illustrates an example of a wearable near-eye display system that utilizes a laser diode to display images to a user.

In the following detailed description, reference is made to the accompanied drawings, which form a part hereof, and which is shown by way of illustration, specific example configurations of which the concepts can be practiced. These configurations are described in sufficient detail to enable those skilled in the art to practice the techniques disclosed herein, and it is to be understood that other configurations can be utilized, and other changes may be made, without departing from the spirit or scope of the presented concepts. The following detailed description is, therefore, not to be taken in a limiting sense, and the scope of the presented concepts is defined only by the appended claims. For example, some examples illustrate laser based head mounted displays, but the techniques disclosed herein may be applied to other laser or light emitting diode based technologies.

Throughout the specification and claims, the following terms take the meanings explicitly associated herein, unless the context clearly dictates otherwise. The meaning of “a,” “an,” and “the” includes plural reference, the meaning of “in” includes “in” and “on.” The term “connected” means a direct electrical connection between the items connected, without any intermediate devices. The term “coupled” means a direct electrical connection between the items connected, or an indirect connection through one or more passive or active intermediary devices and/or components. The terms “circuit” and “component” means either a single component or a multiplicity of components, either active and/or passive, that are coupled to provide a desired function. The term “signal” means at least a wattage, current, voltage, or data signal. The terms, “gate,” “drain,” and “source,” can also mean a “base,” “collector” and “emitter,” and/or equivalent parts.

Laser diodes may be utilized in display applications to render video data for display to a user. Laser diodes are driven with a current during a pixel time of a display and the current driving the laser diode determines the illumination of the pixel. Often, some regions of the display may have many active pixels while other regions of the display may have few active pixels. Also, the video content to be displayed may vary in activity requiring more light output in some frames, e.g. a bright image, and less light in other frames, e.g. dark frames.

In some laser display applications, such as laser based head mounted displays, it is beneficial to have low power usage in order to enable long life battery operation. The voltage-current characteristics for visible light blue and green laser diodes vary greatly with temperature. The threshold current requirement of the laser diode typically dictates the majority of the energy loss in the lasers. To conserve power, in the technologies disclosed herein, the supply voltage for a laser diode is adjusted based on estimated operating voltage or a compliance voltage of the laser to reduce power dissipated by the drive circuitry.

For visible light laser diodes, especially blue and green laser diodes, the current-voltage characteristics are significantly temperature dependent. There is a strong correlation of threshold current with the laser operating temperature. As the temperature of a diode changes, the operating characteristics of the diode, e.g. threshold current and wavelength, also change. Prediction of the threshold current requires accurate measurement of the temperature of the laser diode. Direct measurement of the junction temperature of the laser diode is typically not possible because the laser diode is mounted within a carrier. Measurement of the temperature of the carrier for the laser is less accurate and introduces a delay due to thermal conduction of heat from the laser junction to the carrier. Thus, the threshold current of the device may be more accurately estimated by knowing the junction temperature of the device. Also, accurately characterizing the laser threshold current improves the color accuracy of the display.

In the technologies disclosed herein, the junction temperature of the laser diode is estimated based on the operating current and measured voltage for the laser diode during operation. Based on the current and measured voltage, the junction temperature is estimated using device characteristic calibration data for the laser. The compliance voltage of the laser is adjusted such that the threshold current for the laser is driving the laser at a high level of efficiency for the laser junction temperature.

In another aspect of the technologies disclosed herein, during an active display region, a peak detection logic is monitoring for a peak value of the laser voltage. The peak value of the laser voltage is used to estimate the operating voltage or the compliance voltage of the laser and is suitably adjusted to reduce the overall power requirement. In another aspect of the technologies disclosed herein, during an inactive region of the display, two known current values are applied to the laser and a differential voltage measurement of laser voltage is performed. The voltage sense values measured during non-active display time is mapped to the laser characteristic calibration data to estimate the operating temperature of the laser.

In still another aspect of the technologies disclosed herein, video data input to a display is analyzed to predict an activity or illumination intensity level of the video data and the operating voltage of the laser is adjusted to provide sufficient dynamic range for the laser diode to avoid saturation of the diode during display of the video data.

As discussed above, laser diodes can be used in display applications to render images for viewing by a user. FIG. 1 illustrates one example of a wearable near-eye display system 10 that can utilize a laser diode to display images to a user wearing the system 10. The illustrated display system is a binocular display system; it employs a complementary pair of scanned-beam displays 12—viz., right-eye display 12R and left-eye display 12L. In other examples, a single scanned-beam display may be used for both eyes.

Display system 10 includes an integrated computer system 14 that is operatively coupled to the scanned-beam displays and to other display-system componentry. The computer system 14 includes a logic system 16 and associated computer memory 18. The logic system and computer memory may be configured to render display images provided to the right and left scanned-beam displays and to enact any processing and control function disclosed herein. It will be noted that the display images formed by the right and left scanned-beam displays need not be identical, but may exhibit a controlled positional disparity in the virtual imagery therein, so as to create a 3D stereo effect.

Figure 2:
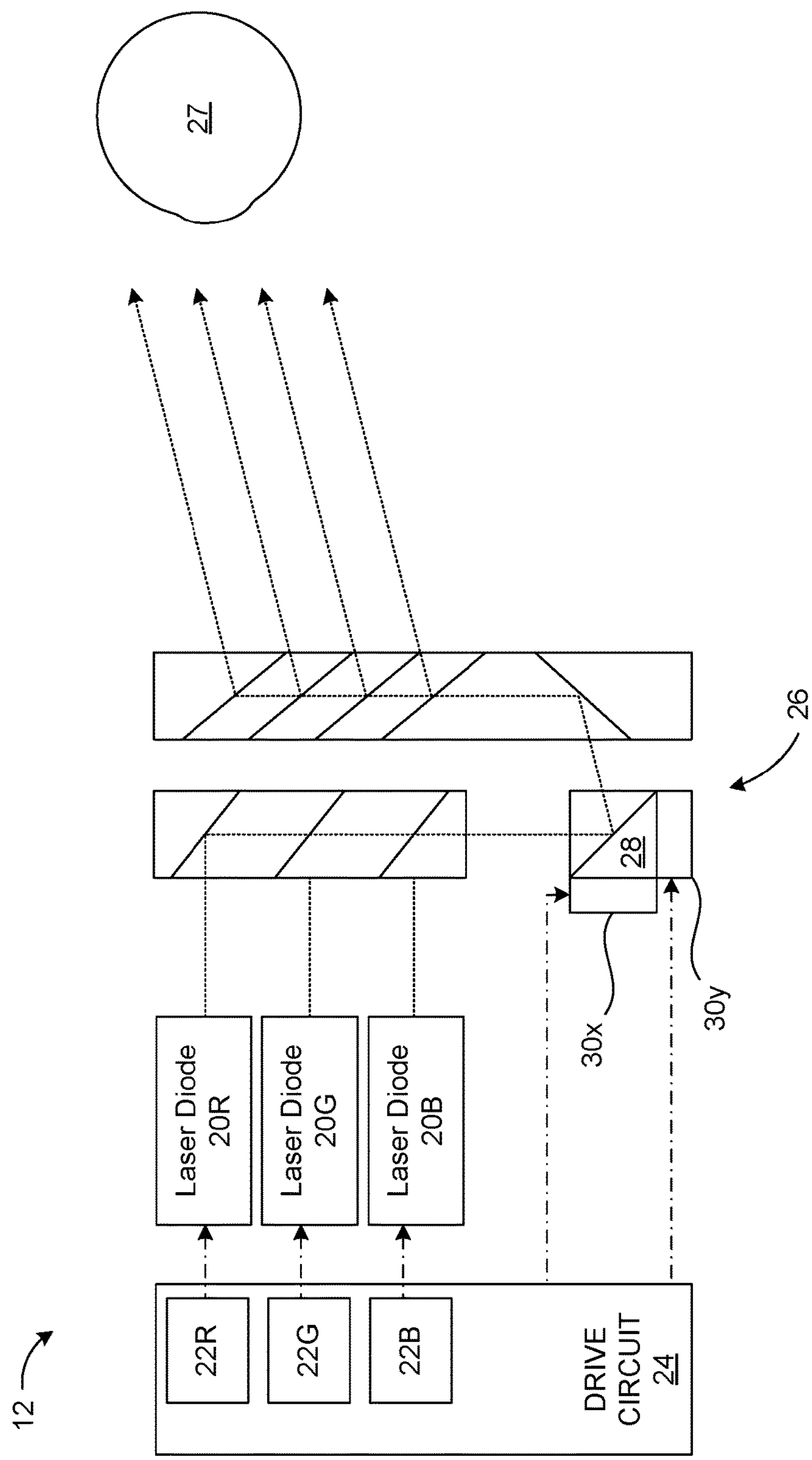
FIG. 2 is a functional block diagram that shows aspects of an example scanned-beam display.

FIG. 2 is a functional block diagram that shows aspects of an example scanned-beam display 12. Scanned-beam display 12 is a color display; it includes three laser diodes 20—a red-emitting laser diode 20R, a green-emitting laser diode 20G, and a blue-emitting laser diode 20B. In a monochrome display, a single laser diode may be sufficient. Each laser diode 20 of display 12 is coupled operatively to an associated driver 22 that provides electrical bias to the laser diode pursuant to a control signal from computer system 14. Taken together, each laser diode and associated driver comprise a modulated light source. In the illustrated example, drivers 22R, 22G, and 22B are incorporated into an integrated drive circuit 24 configured to provide shared timing among the drivers, and other control functions.

In scanned-beam display 12, a coherent, collimated beam from each laser diode 20 is received by an active optic 26. The active optic is configured to redirect the beam along a moving axis that scans across and down the field of view ("FOV") of the user's right or left pupil 27. More particularly, drive circuit 24 is configured to modulate control of the active optic and to synchronously modulate the current drawn through each of the diode lasers, such that the desired display imagery is formed in the FOV.

In the illustrated example, active optic 26 includes a microelectromechanical system (MEMS) mirror 28. The mirror is coupled to a pair of piezoelectric transducers 30. Transducer 30X controls the deflection of the mirror in a first direction; transducer 30Y controls the deflection of the mirror in a second direction, perpendicular to the first. Drive circuit 24 provides electrical bias to transducers 30 pursuant to a control signal from computer system 14. Through appropriate control of the transducers, mirror 28 is made to raster the beams of the laser diodes across and down the user's FOV. As the beams reach a given point (X, Y) in the FOV, the current applied to the red-, green- and blue-emitting laser diodes may be adjusted so as to achieve the desired brightness and color for that point. This control feature is enacted continuously as the beams scan through the user's FOV, or through a predetermined portion thereof. In this manner, the control signals provided to each laser diode 20 and transducer 30 define the color display image formed in the FOV.

It should be appreciated that the term 'raster' is not meant to imply that the laser beams necessarily scan a complete horizontal row of the FOV before descending to an incrementally lower row. Rather, the control signal applied to transducers 30X and 30Y may be such as to achieve a harmonic resonance in mirror 28. In traversing the FOV, the beams may trace out one or more complex trajectories (e.g., Lisajous figures). Provided that the overall deflection of mirror 28 can be measured or predicted at any point in time, a display image may be formed by adjusting the current through each diode laser as a function of the deflection. In some examples, active optic 26 may not include a mirror, but may include one or more transmissive or reflective elements having controllable diffractive properties. Suitable examples include tunable Bragg gratings and liquid-crystal embossed blazed gratings. By modulating the diffractive properties of such elements in real time, a laser beam may be scanned across and down the user's FOV.

Figure 3:
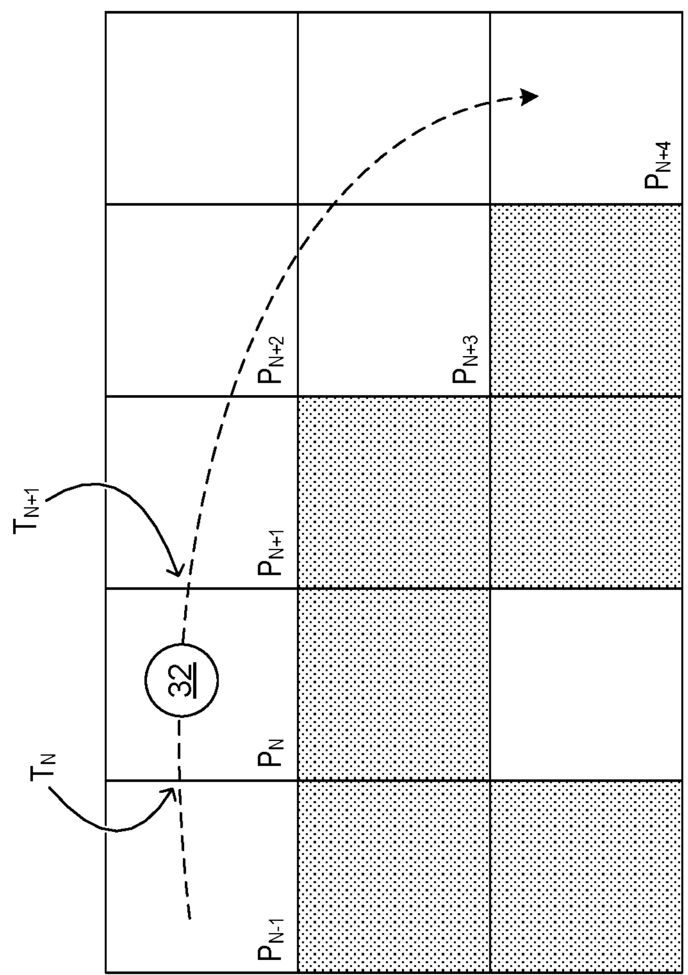
FIG. 3 shows aspects of an example pixel map illustrating the manner in which emission from laser diodes may be synchronized to the beam deflection effected by an active optic.

FIG. 3 shows aspects of an example pixel map illustrating the manner in which emission from laser diodes 20 may be synchronized to the beam deflection effected by active optic 26. In the illustrated example, beam position 32 (common to all beams, in some examples) crosses the left boundary of pixel PN at time TN. The emission intensities of the red-, green-, and blue-emitting laser diodes are then adjusted so as to achieve the required brightness and color mixture for pixel PN in the current image frame. At time TN+1, the beam position exits the right boundary of pixel PN and crosses into pixel PN+1. Now the emission intensities are readjusted to achieve the required brightness and color mixture for pixel PN+1. Intensity adjustment continues for each pixel that the beam position intersects, and through each successive image frame.

Based on the above mapping, the luminous emission required of a given laser diode 20 to illuminate pixel PN may be provided in the form of an optical pulse of appropriate integrated power. The optical pulse may be as wide as the time window $\Delta$Tmax=TN+1−TN, when beam position 32 is within the boundaries of pixel PN. Irrespective of the detailed trajectory of the beam position as it traverses the FOV, the average time window is inversely proportional to the horizontal and vertical resolutions of the display-image frame and to the frame refresh rate. At a refresh rate of 60 Hertz and a 1968×1280 display resolution, for instance, the time window $\Delta$Tmax may be as short as 4.5 nanoseconds (ns) at the center of the image frame.

Figure 4A:
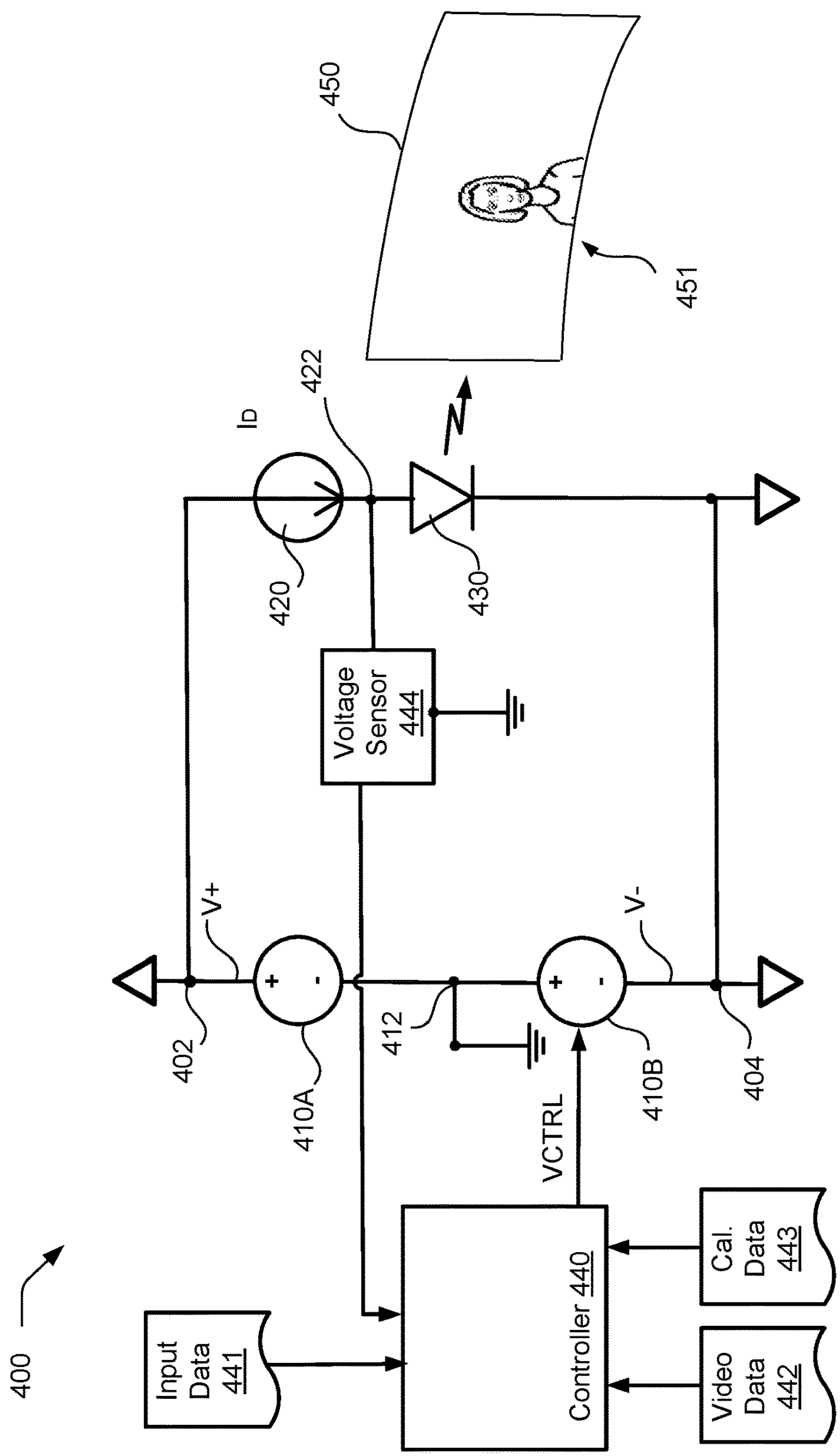
FIG. 4A is a circuit diagram illustrating an example of a laser display system 400 suitable for application of the technologies disclosed herein.

FIG. 4A is a circuit diagram illustrating an example of a laser display system 400 suitable for application of the technologies disclosed herein. For example, system 400 can be utilized for each of the drive circuits 22R, 22G and 22B shown in FIG. 2. In this example, a first supply rail 402 is supplied with a first supply voltage, e.g. V+, by a first voltage supply 410A. A second supply rail 404 is supplied with a second supply voltage, e.g. V−, by a second voltage supply 410B. A current source 420 is coupled between the first supply rail 402 and a circuit node 422 that is coupled to one terminal, e.g. an anode, of a laser diode 430. A second terminal of laser diode 430, e.g. a cathode, is coupled to the second supply rail 404. The current source 420 provides a drive current to laser diode 430 to output laser light for projection onto a display surface 450 to render a video data image 451.

System 400 also includes a controller 440. In this example, controller 440 receives input data 441, video data 442 and calibration data 443. A voltage sensor 444 is coupled to circuit node 422 to sample and measure an output voltage at circuit node 422 coupled to the first terminal of laser diode 430. Controller 440 receives the voltage measurement from voltage sensor 444 and outputs a voltage control signal VCNTRL to voltage supply 410B that causes the voltage supply to change the level of the second supply voltage V−. Controller 440 adjusts the second supply voltage V− to manage power usage, but avoid saturation of the laser diode, by generating VCTRL as discussed in detail below.

Figure 4B:
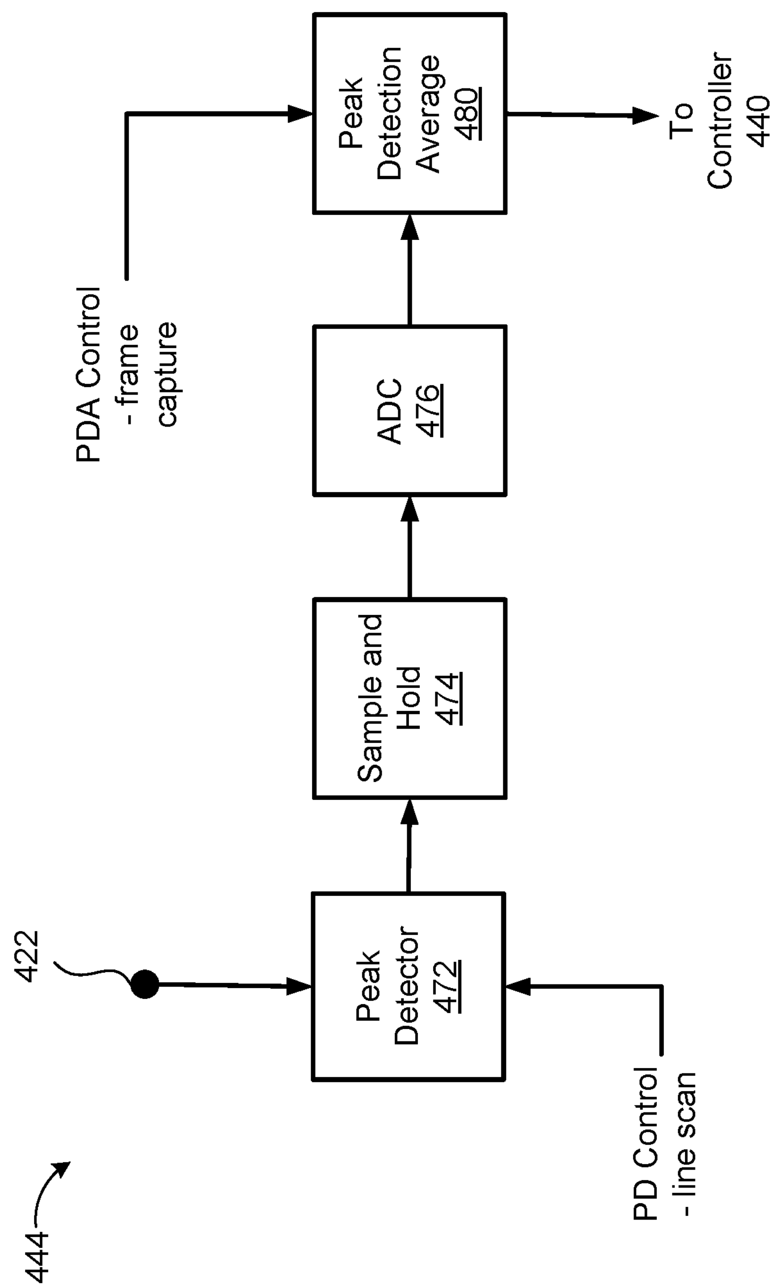
FIG. 4B is a circuit diagram illustrating an example of voltage sensor that detects a peak output voltage during a sample period.

FIG. 4B is a circuit diagram illustrating an example of voltage sensor 444 that detects a peak output voltage during a sample period, such as a video frame. In this example, voltage sensor 444 includes a peak detector 472 for detecting peaks in the measured voltage at circuit node 422 coupled to an anode of laser diode 430. The peak detector may, for example, detect the peak voltage that occurs during a horizontal blanking period pertaining to a line scan of the video output or a vertical blanking period pertaining to a frame of the video output. A sample and hold 474 samples and holds the detected peak voltage received from peak detector 472. The peak voltage held by sample and hold 474 is converted to a digital value representing the magnitude of the peak voltage by analog-to-digital converter ("ADC") 476. In this example, a peak detection average circuit 480 averages the sampled peak voltages over time to prevent transient events from causing major swings in the detected peak voltage. A digital value representing an averaged peak voltage level is output to controller 440. One of ordinary skill in the art will readily note that a variety of other approaches may be utilized for peak detection and sampling without departing from the scope of the techniques disclosed herein. For example, the controller 440 may receive the output of ADC 476 and perform a variety of filtering algorithms to the sampled peak voltages, e.g. weighted averaging or integrating the detected peaks with information on incoming video data.

As noted above, controller 440 utilizes the peak voltage information from voltage sensor 444 to control voltage supply 410B and set the level of the second supply voltage V− with multiple factors in consideration: power management, minimizing output delay, and maintaining a dynamic range for the laser diode that is sufficient for outputting the video signal. However, these factors may conflict with one another.

For power management, the second supply voltage V− can be selected to reduce the voltage across laser diode 430, e.g. V− is made less negative in the example of FIG. 4. Reducing the voltage drop across laser diode 430, however, increases the possibility that video input data may cause laser diode 430 to saturate and distort the outputted light signal, e.g. clip the output signal. To minimize delay, V− is set such to maintain the laser diode 430 at its current threshold when inactive. V− may be set to increase the dynamic range of laser diode 430, e.g. −1.8 volts, and avoid saturation, but, if signal output by laser diode 430 does not utilize the dynamic range, then power is unnecessarily consumed.

Figure 5A:
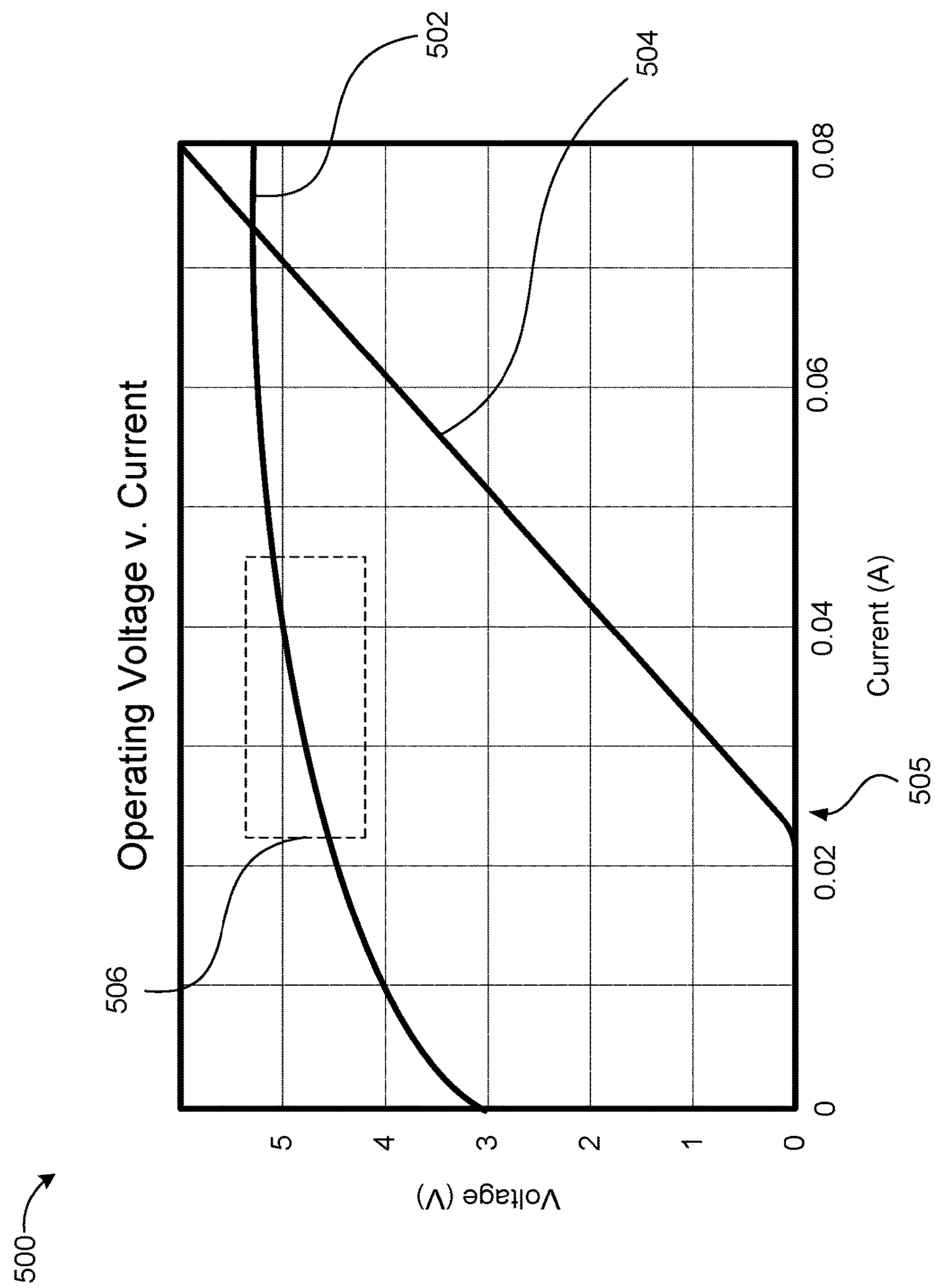
FIG. 5A is a graph illustrating the operating voltage across the laser diode versus current curve with a light output versus current curve overlaid.

FIG. 5A is a graph 500 illustrating an operating voltage versus current curve 502 with a light output versus current curve 504 overlaid to illustrate one example of a target operating range 506 for laser diode 430 under the control of controller 440. Light output curve 504 illustrates a threshold current 505 at which the diode begins to emit light. To reduce turn on delays for the laser diode, a lower end voltage for operating range 506 is the voltage corresponding to the threshold current 505. An upper range voltage for operating range 506 may be based on power management concerns or dynamic range concerns. For the example of FIG. 5A, the upper range is selected based on a portion of curve 502 with slope that provides a high level of efficiency in the operation of the laser diode. Controller 440, in this example, operates to adjust second supply voltage V− such that the voltage drop across laser diode 430 is maintained within the range 506.

Figure 5B:
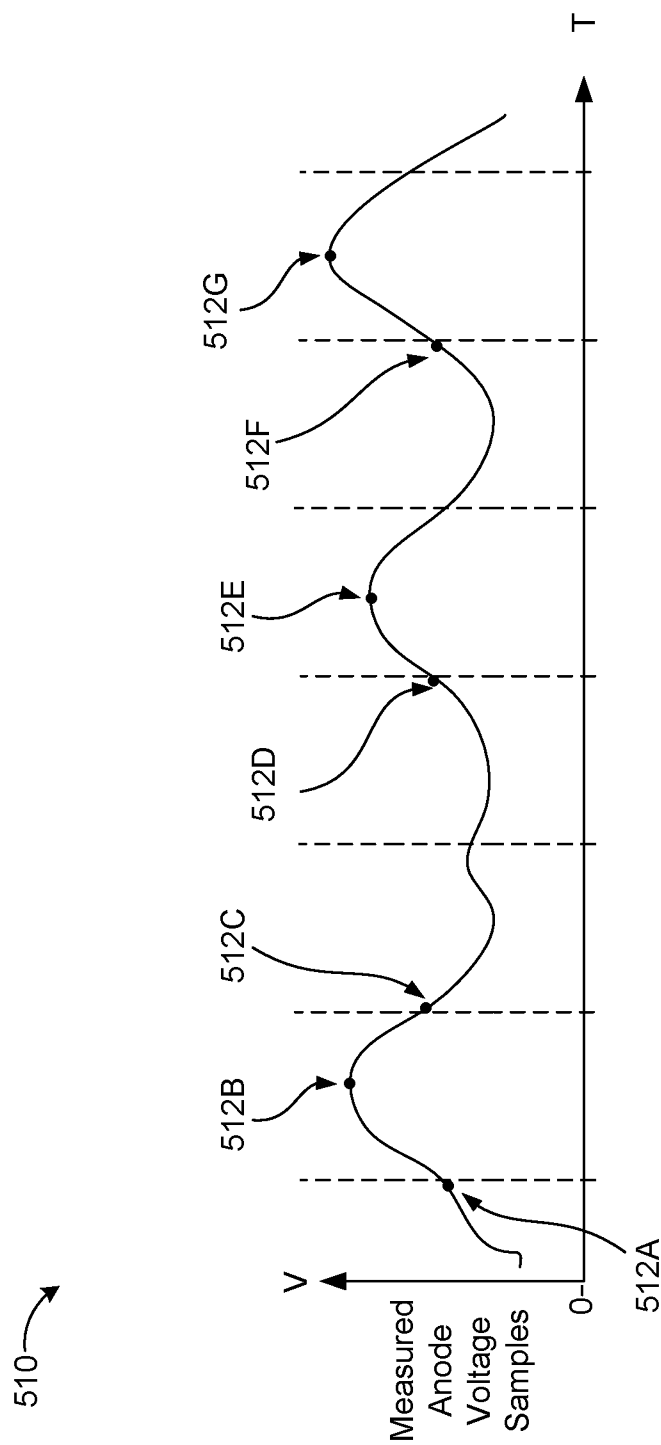
FIG. 5B is a waveform diagram illustrating a measured laser diode anode voltage monitored by the peak detector of the voltage sensor shown in FIG. 4A and FIG. 4B.

FIG. 5B is a waveform diagram illustrating the output voltage at circuit node 422 as it is monitored by peak detector 472 of voltage sensor 444 in FIGS. 4A and 4B. In this example, the waveform illustrates variations in the output voltage and the peak detector detects the peak voltage that occurs during each video frame. Peak voltage 512A is the peak voltage detected during a first frame, peak voltage 512B is the peak voltage detected during a second frame, peak voltage 512C is the peak voltage detected during a third frame, etc.

Controller 440 may set a level for the second supply voltage V− based on peak voltage 512A, an averaged peak voltage at the end of the first frame, or another treatment of the peak voltage selected for a particular implementation. Peak voltage 512B for the second frame is a higher voltage level than peak voltage 512A for the first frame, which may be due to higher activity or illumination levels in the second frame. Controller 440 will generate VCTRL output to second voltage supply 410B to increase the bias voltage across laser diode 430, i.e. make second supply voltage V− more negative, to avoid saturating laser diode 430 during operation. A sudden increase in activity of laser diode 430 may result in saturation, but subsequent adjustment of the bias voltage by controller 440 will attempt to reduce or avoid saturation by increasing the dynamic range of the laser diode 430.

Subsequent peak voltages 512C and 512D are lower than peak voltage 512B, which may results in excessive power being utilized to bias laser diode 430. Controller 440 responds to this situation to change VCTRL output to second voltage supply 410B to decrease the bias voltage across laser diode 430, i.e. make second supply voltage V− less negative, to reduce the power consumed by laser diode 430. As the peak output voltage changes over a sequence of frames, controller 440 adjusts the bias voltage to compensate for changes in the video output. Adjustments to the bias voltage may be treated in a number of ways to smooth out rapid changes, such as through averaging or integrating the detected peak voltage levels over time.

Figure 6:
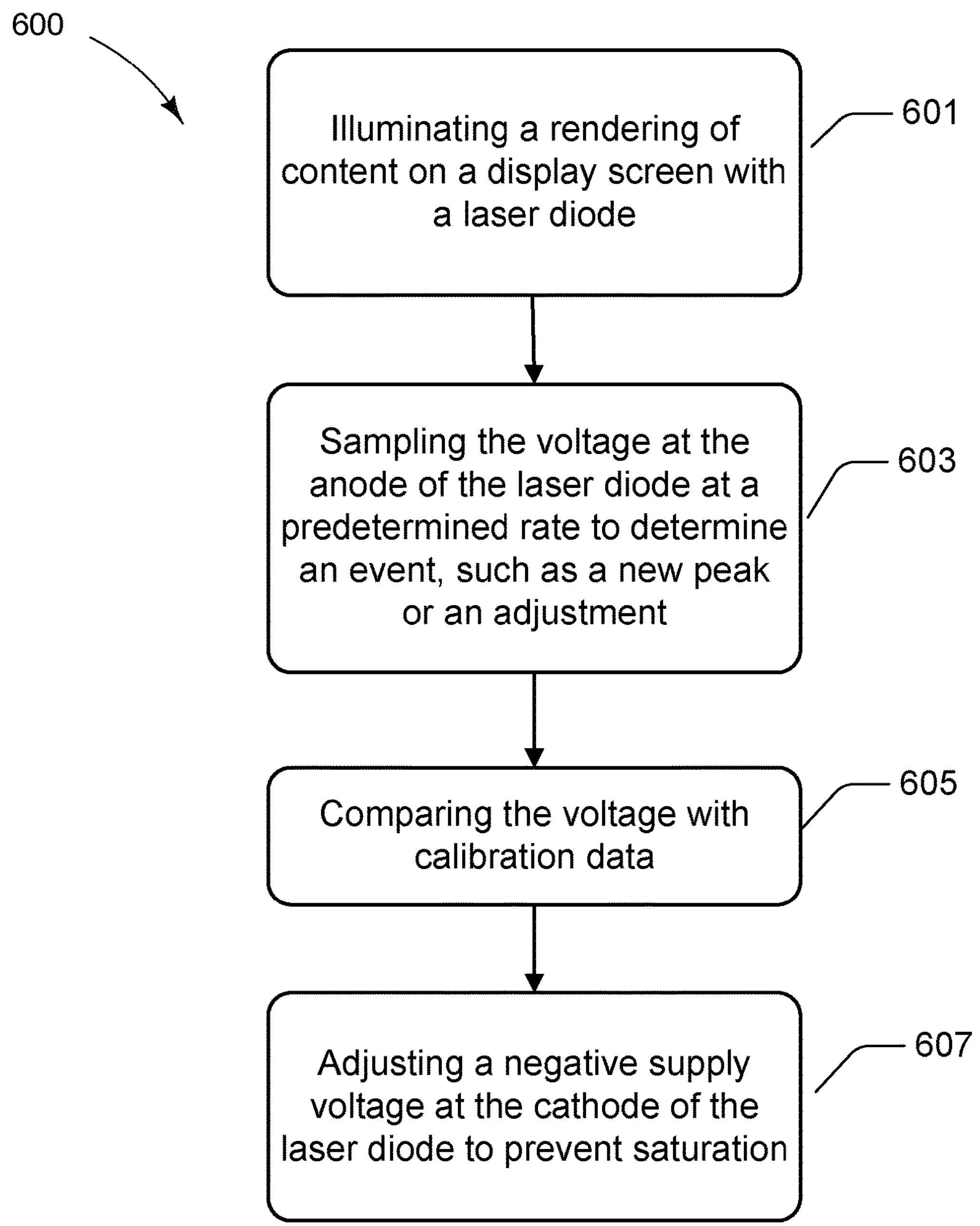
FIG. 6 is a control flow diagram illustrating an example of a power and dynamic range management operation of the laser display system of FIG. 4A.

FIG. 6 is a control flow diagram illustrating an example of a power and dynamic range management operation 600 of the laser display system 400 of FIG. 4A. At 601, the system 400 operates to illuminate a rendering of content on a display screen with a light emitting diode, e.g. laser diode 430. At 603, system 400 operates to sample the output voltage, e.g. the voltage at the anode of laser diode 430, at a predetermined rate, e.g. each video frame, to determine an event, such as a new peak voltage or an adjustment of voltage. At 605, system 400 operates to compare the sampled voltage, e.g. averaged peak voltages, with calibration data, such as data related to the device characteristic curves 502 and 504 in FIG. 5A. At 607, system 400 operates to adjust a supply rail voltage, e.g. V− at supply rail 404, to bias the light emitting diode to conserve power and provide sufficient compliance voltage to the laser diode to prevent saturation, e.g. apply a bias voltage to a cathode of laser diode 430 that provides dynamic range that is high enough to accommodate the estimated peak output voltage, but not substantially higher than necessary in order to conserve power.

Note that input data 441 may also have an impact on the bias voltage applied to the laser diode. For example, input data indicating a user input to increase or decrease the brightness of the rendered display 451 may cause controller 440 to adjust V− at supply rail 404 to increase or decrease the bias voltage to laser diode 430. Similarly, input data indicating an increase or decrease in ambient light may also cause controller 440 to adjust V− at supply rail 404.

Another aspect of the techniques disclosed relates to temperature compensation in the laser diode. A light emitting diode, e.g. laser diode, will exhibit different operating voltage versus current characteristics based on the junction temperature of the diode. The junction temperature fluctuates based on the amount of optical power emitted and the fluctuation can occur rapidly, e.g. on the order of milliseconds. Thus, a laser diode that is actively rendering video data typically exhibits an increased junction temperature, which affects the performance of the diode, e.g. device characteristics, efficiency and frequency shifts.

Figure 7A:
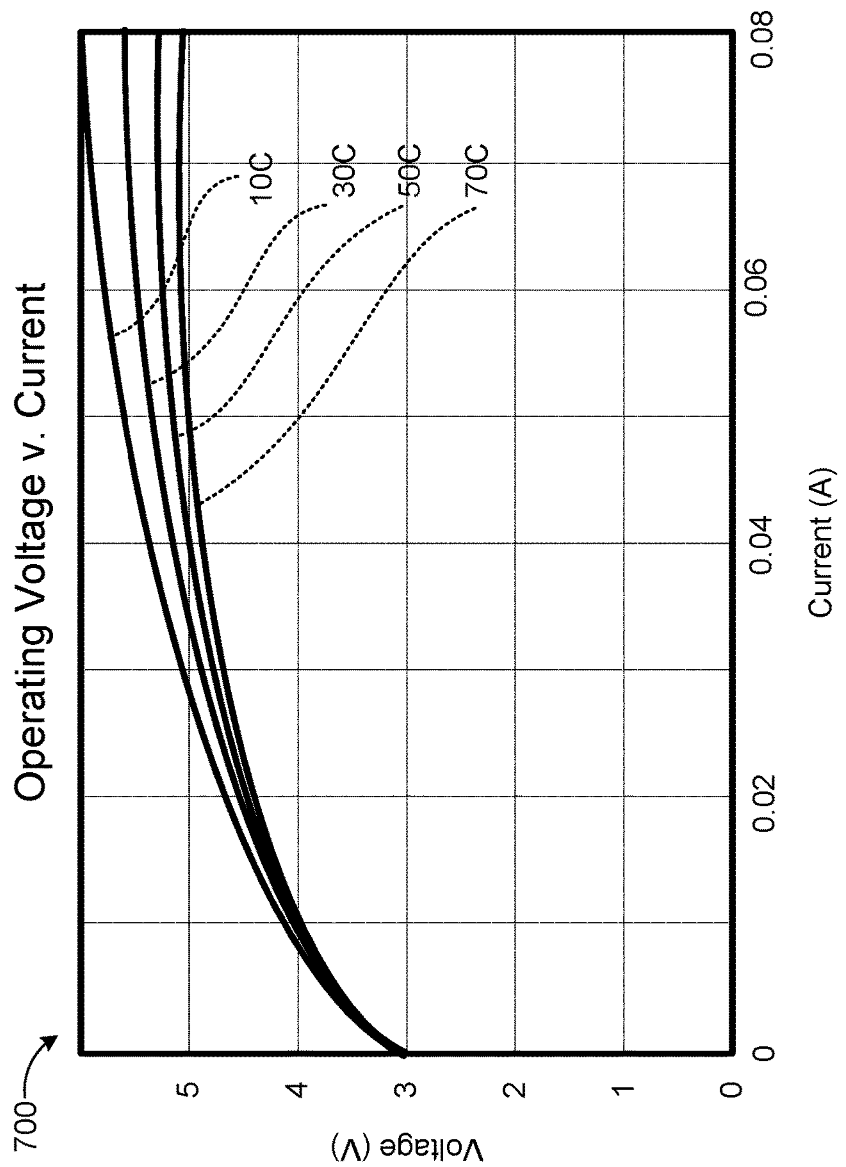
FIG. 7A is a graph illustrating examples of a green laser diode continuous wave operating voltage v. operating current characteristic curves at different junction temperatures of a laser diode.

FIG. 7A is a graph 700 illustrating examples of a blue laser diode device operating voltage v. operating current characteristic curves at different junction temperatures of the laser diode. Calibration data reflecting the characteristic curves is stored in calibration data 443 for use by the controller 440. As can be seen in graph 700, the operating voltage v. current curve for 10 degrees Celsius is different than the operating voltage v. current curve for 70 degrees Celsius. As temperature fluctuates, the characteristic behavior of the device changes.

Figure 7B:
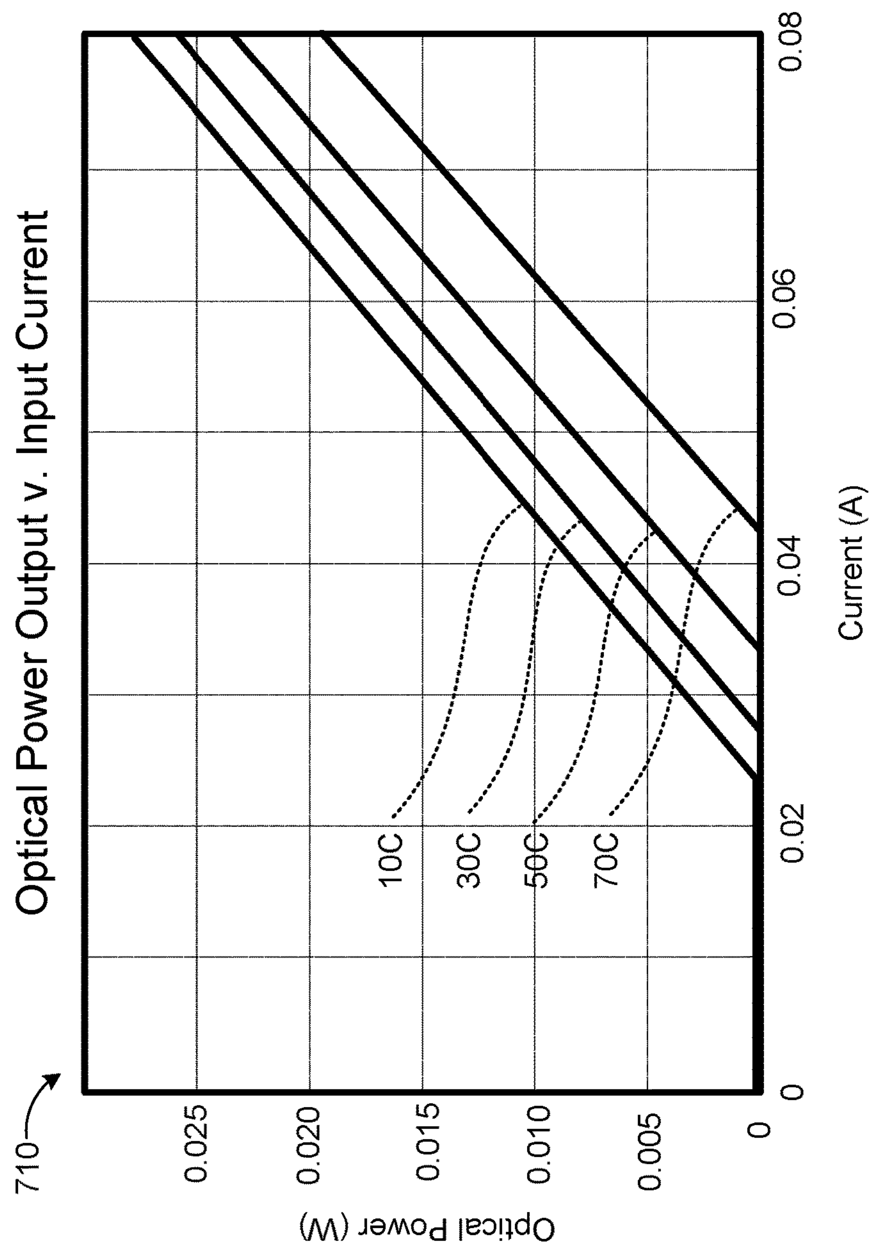
FIG. 7B is a graph 710 illustrating examples of laser diode device optical power output v. operating current characteristic curves of a green laser diode at different package temperatures.

Junction temperature also affects the light output characteristics of the blue laser diode. FIG. 7B is a graph 710 illustrating examples of laser diode device optical power output v. operating current characteristic curves at different junction temperatures of the laser diode. Note that the optical power output of the laser diode rises rapidly once the threshold current is reached. However, the threshold current for the diode varies significantly at different diode junction temperatures. Thus, when the laser diode junction temperature rises, such as when the laser diode is particularly active, the threshold current rises. If the minimum biasing voltage for the device is based on the threshold current, as discussed with respect to FIG. 5A, then the biasing voltage may need to be changed to compensate for a different threshold current at a different temperature.

Conventionally, a thermistor may be used to monitor the temperature of a package or carrier for the laser diode. The biasing may be adjusted based on the thermistor measurements for temperature compensation. However, the temperature of the package or carrier does not accurately represent the junction temperature of the laser diode. The package or carrier typically introduces a number of components with thermal capacitance and thermal interfaces, which introduces inaccuracies and delays between the junction temperature and the thermistor. Additionally, the time required to fully thermalize the laser diode package is typically measured in seconds. In another conventional approach, optical feedback is used to control laser output, but this approach also has thermal and electrical dependencies that complicate the approach and degrade the accuracy of the estimated operating temperature. Furthermore, bandwidth, signal-to-noise ratio, and low response speed of optical feedback measurements introduce inaccuracies and slow active correction. Because the junction temperature varies rapidly, e.g. on the order of milliseconds, the inaccuracies and delays in the conventional approach degrade the quality of temperature compensation that is based on conventional approaches.

Figure 7C:
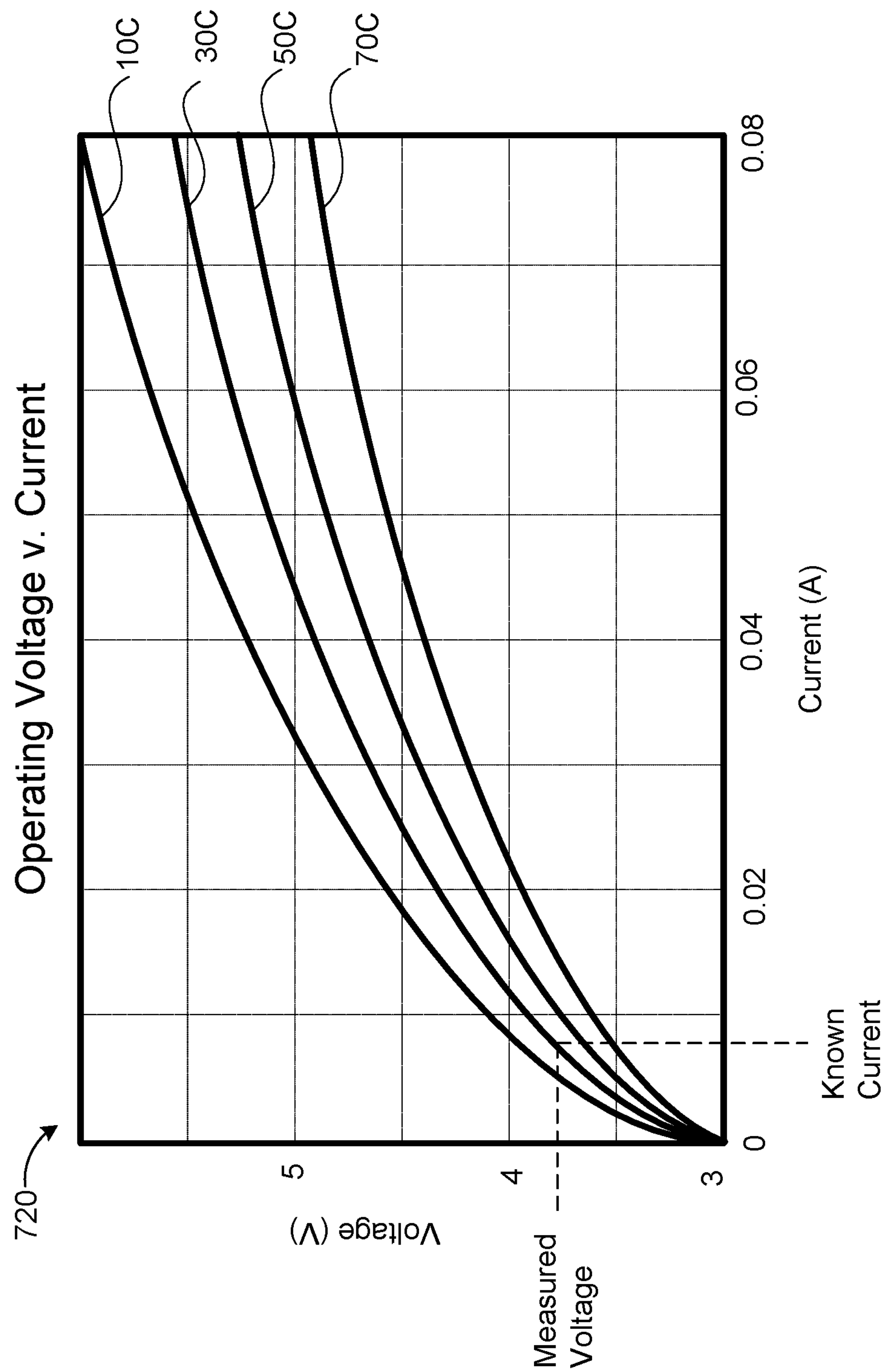
FIG. 7C is a graph illustrating an example of a mapping of a measured voltage and a known current to device characteristic curves for different temperatures.

In certain aspects of the technologies disclosed herein, the bias voltage for the laser diode is adjusted to compensate for changes in junction temperature. In this aspect, the output voltage at the laser diode is measured at a known current (e.g. the current output by a current source to a laser diode biased well below its threshold current) and the measured output voltage and known current are used to estimate the junction temperature based on mapping these values to device characteristic data based on temperature. In this single ended approach, the controller maps the known current and the measured operating voltage to calibration data for the device in order to estimate the junction temperature of the laser diode. FIG. 7C is a graph illustrating an example of a mapping of a measured voltage and a known current to device characteristic curves for different temperatures. In this example, a current is known for laser diode, e.g. the drive current applied to current node 422 and laser diode 430 by current source 420, and the output voltage at the laser diode is measured, e.g. the voltage at current node 422 is measured by voltage sensor 444. Device characteristic data for different junction temperatures, e.g. the device characteristic curves shown in FIG. 7C, is stored in calibration data 443. In the single ended example of FIG. 7C, the controller 440 maps the known current, e.g. the current output by current source 420 during a period of inactivity, and measured operating voltage to the calibration data 443 in order to estimate the junction temperature of the laser diode. Based on the estimated junction temperature, controller 444 adjusts VCTRL to cause voltage supply 410B to change the second supply voltage V− in order to bias laser diode 430 to compensate for a change in threshold current at the estimated junction temperature. The temperature estimation may also be utilized to compensate for wavelength shifts due to temperature.

Figure 7D:
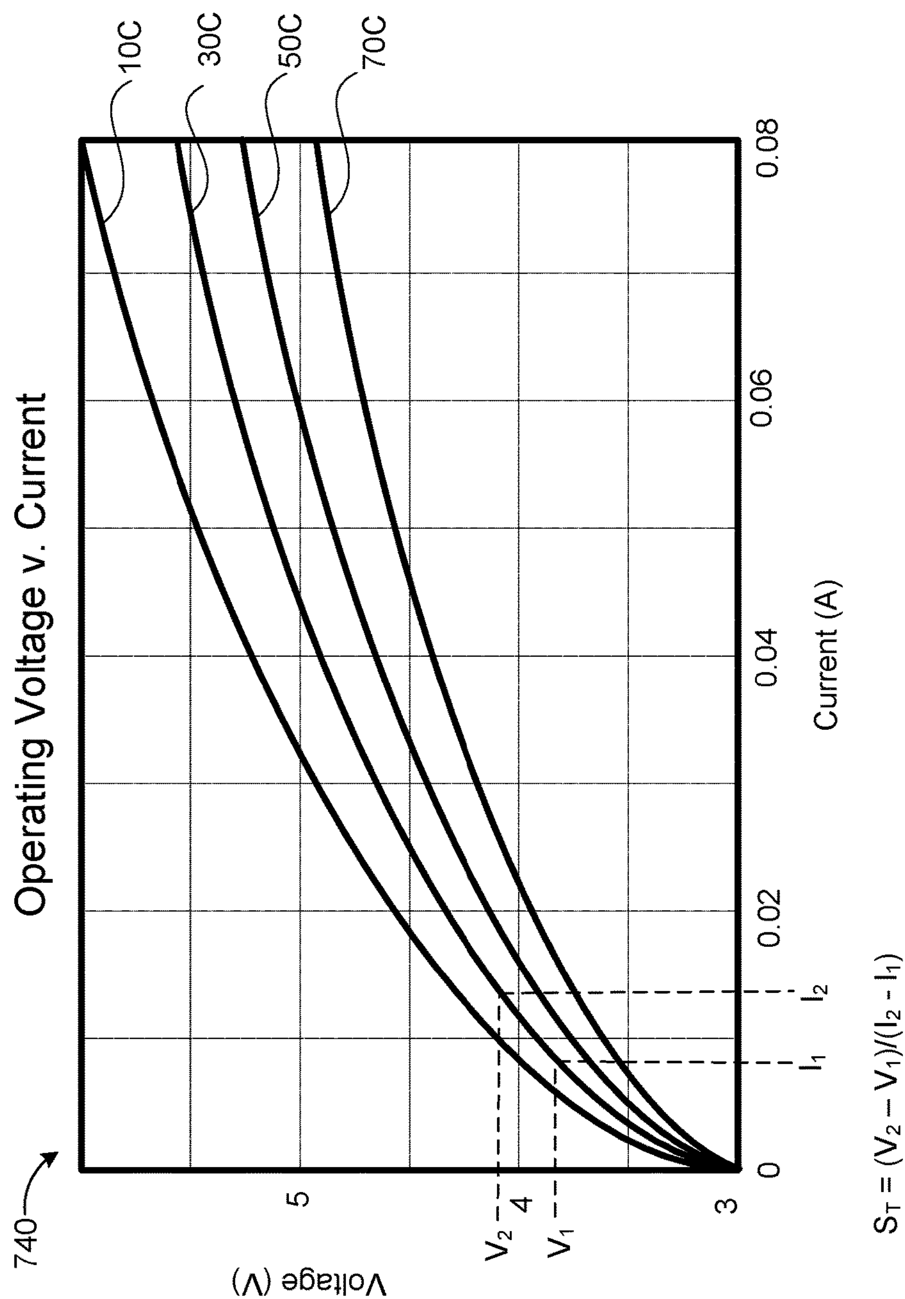
FIG. 7D is a graph illustrating a differential approach to estimating junction temperature.

FIG. 7D is a graph 740 illustrating a differential approach to estimating junction temperature. In this approach, output voltage measurements V1 and V2 are made at known current I1 and I2, respectively, and these values are used to determine a slope ST of the device characteristic. The slope ST is then mapped to the device characteristic data for different junction temperatures stored in calibration data 443 to estimate the junction temperature of the laser diode. In the example shown in FIG. 7D, the currents I1 and I2 are selected at points corresponding to a region of the device characteristic curves having a high level of difference in slope between the curves at different temperatures.

Note that the estimates of junction temperature described with respect to FIGS. 7C and 7D, as well as variations on the techniques illustrated, are highly accurate representations of actual junction temperature, e.g. without noise and inaccuracies introduced by packaging, and can be performed rapidly to detect rapid changes in junction temperature due to laser diode activity. Controller 440 can, therefore, rapidly adjust a supply rail voltage, e.g. V− at supply rail 404, to bias the light emitting diode, e.g. laser diode 430, to compensate for temperature fluctuations.

Figure 8:
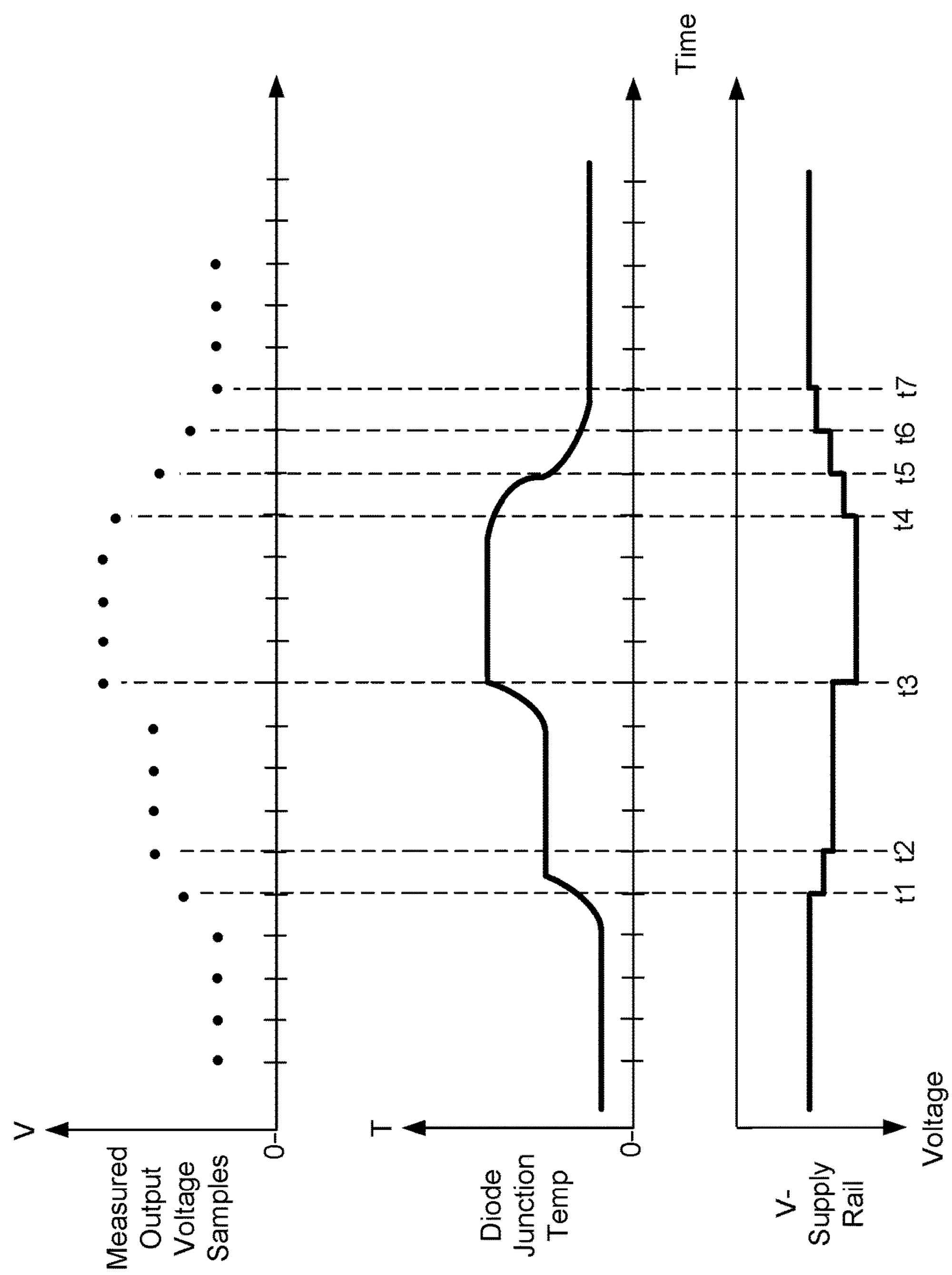
FIG. 8 is a waveform diagram illustrating an example of temperature compensation performed by the controller of FIG. 4A.

FIG. 8 shows three waveform diagrams illustrating an example of temperature compensation performed by controller 440. The example shows measured output voltage samples, e.g. at circuit node 422 coupled to an anode of laser diode 430, diode junction temperature fluctuations and adjustments to the supply rail voltage, e.g. V− at supply rail 404, correlated over a period of time. Note that the sampling rate for the output voltage can be selected to allow rapid response to temperature fluctuations, e.g. sampling every 40 milliseconds.

The diode junction temperature is initially at a steady level reflecting a consistent level of activity, but begins to increase. At t1, the measured output voltage increases reflecting the increased junction temperature. Controller 440 utilizes the measured output voltage and known current at t1 to estimate the junction temperature and increase the bias voltage, e.g. make V− more negative, to compensate for the increased temperature. At t2, the measured output voltage shows a further increase in junction temperature, which controller 440 compensates for by increasing the bias voltage. The junction temperature levels off, as reflected in the steady level of the output voltage samples, until another increase in temperature is detected at t3, when controller 440 increases the bias voltage again to compensate for the temperature change.

After a period of high activity ends, the junction temperature begins to decrease, as reflected in the output voltage sample at t4. Controller 440 detects the drop in temperature and reduces the bias voltage, e.g. makes V− less negative, to compensate for the lower temperature and reduce power usage. The junction continues to cool, as detected at t5, t6 and t7, and controller 440 adjusts the bias voltage accordingly. Note that a variety of smoothing techniques, such as averaging or integration, may be applied to measured output voltage samples in determining the bias voltage. Also note that this temperature compensation aspect of the disclosed techniques is readily combined with the aspect described above relating to power and dynamic range management.

Figure 9:
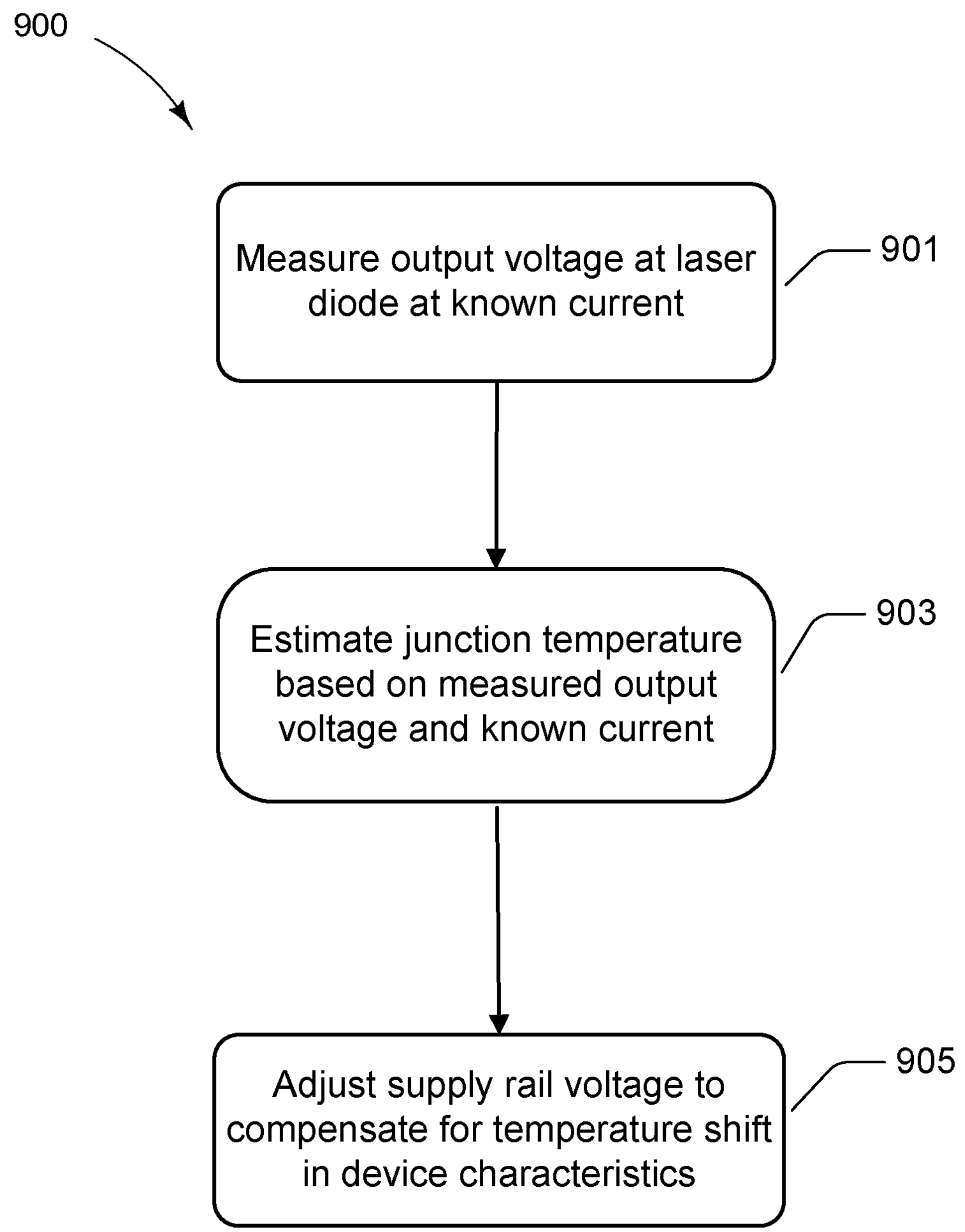
FIG. 9 is a control flow diagram illustrating an example of a temperature compensation operation according to the techniques described herein.

FIG. 9 is a control flow diagram illustrating an example of a temperature compensation operation 900 according to the techniques described herein. At 901, the output voltage at the laser diode 430, e.g. the voltage at circuit node 422, is measured at a known current, e.g. the drive current of current source 420. At 903, the junction temperature for the laser diode is estimated based on the measured output voltage and known current. At 905, a supply rail voltage, e.g. V− at supply rail 404, is adjusted to temperature compensate the bias voltage of the laser diode based on the temperature shift in device characteristics.

The power and dynamic range management aspects and temperature compensation aspects described above are substantially feedback techniques for dynamically adjusting the bias voltage of a light emitting or laser diode. Another aspect of the techniques described herein pertains to feed forward bias adjustment based on the characteristics of incoming video data. As noted above, laser diodes are driven with a current during a pixel time of a display. Often, some regions of the display may have many active pixels while other regions of the display may have few active pixels. Also, the video content to be displayed may vary in activity requiring more light output in some frames, e.g. a bright image, and less light in other frames, e.g. dark frames. And it can be anticipated that an upcoming period of high activity in video data will likely result in an increase in junction temperature in the laser diode.

The characteristics of the incoming video data to be rendered using the laser diode can be known and, in some examples, provided to laser display system 400 before the video data is rendered, e.g. video data 442 input to controller 440. For example, the activity or illumination level in an incoming video frame or sequence of frames may be represented in video characteristic data, such as a histogram that is input to controller 440. Controller 440 may utilize the video characteristic data to adjust the bias voltage for the laser diode in anticipation of the effect of the incoming video data on the laser diode.

Figure 10:
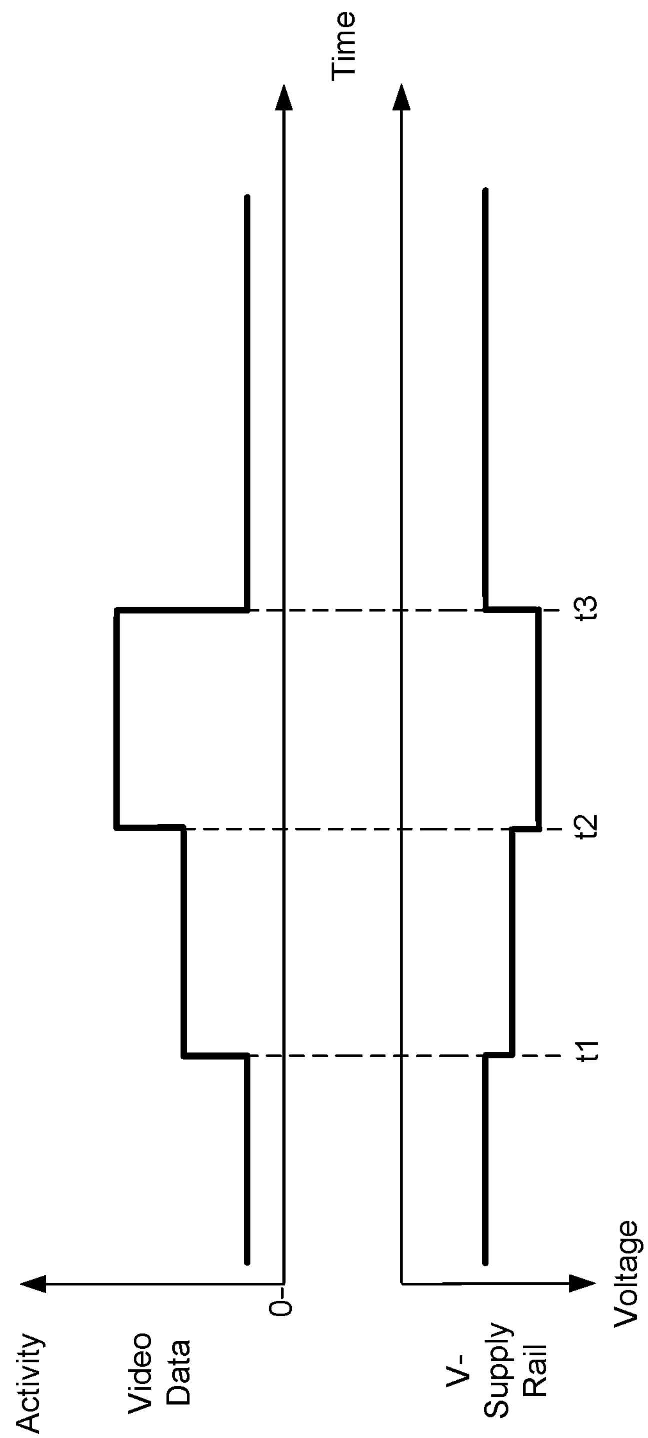
FIG. 10 is a graph illustrating an example of a histogram of video data activity correlated to adjustments to a voltage at a supply rail.

FIG. 10 is a graph illustrating an example of a histogram of video data activity correlated to adjustments to V− at supply rail 404. In this example, the histogram indicates, at t2, an increase in video activity in the incoming video data to the laser display system 400. Controller 440, in order to anticipate the impact of the incoming video data, adjusts V−, e.g. makes V− more negative, to increase the bias voltage for laser diode 430 and, therefore, the dynamic range of laser diode 430. Increasing the dynamic range of laser diode 430 will avoid or reduce saturation of laser diode 430 during rendering of the incoming video data.

At t2, the histogram indicates a further increase in video activity, such as for the next frame or sequence of frames starting at t2. Controller 440 further increases the bias voltage for laser diode 430 in anticipation of the increased video activity beginning at t2. At t3, the histogram indicates a decrease in video activity, such as for the next frame or sequence of frames starting at t3. Controller 440 decreases the bias voltage for laser diode 430, e.g. makes V− less negative, in anticipation of the decreased video activity beginning at t3. The decreased bias voltage reduces the power consumption of the laser diode.

The feed forward aspect of the disclosed techniques may, in some examples, be used in combination with the power and dynamic range management aspect and the temperature compensation aspect of the disclosed techniques. For example, controller 440 may anticipate that the sustained level of video activity may cause the junction temperature of the laser diode to increase and adjust the bias voltage in anticipation of the temperature increase. In another example, controller 440 may decrease the bias voltage gradually starting at t3 in anticipation of a gradual cooling of the junction temperature with the lower video activity starting at t3.

Figure 11:
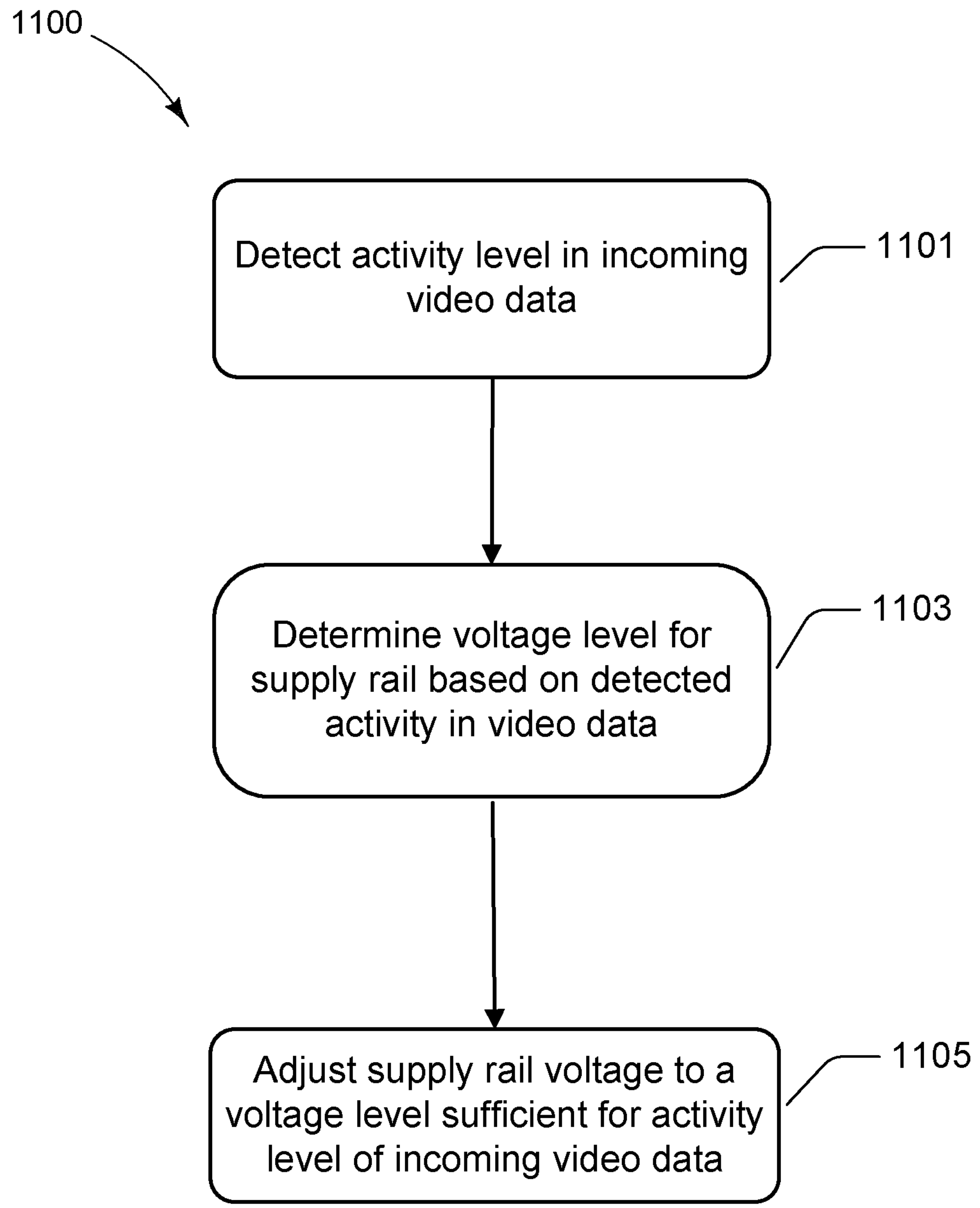
FIG. 11 is a control flow diagram illustrating an example of a feed forward bias voltage adjustment operation according to the techniques described herein.

FIG. 11 is a control flow diagram illustrating an example of a feed forward bias voltage adjustment operation 1100 according to the techniques described herein. At 1101, the activity level of the incoming video data is detected, e.g. an increase in activity of the video content is indicated in a histogram. At 1103, a voltage level for a supply rail, e.g. V− at supply rail 404, is determined to bias the laser diode based on the anticipated activity level detected in the incoming video data. At 1105, the supply rail voltage is adjusted to the determined voltage level, e.g. VCTRL causes voltage supply 410B to change to adjust the bias voltage to laser diode 430.

Note that the operations illustrated in FIGS. 6, 9 and 11 are exemplary operations in accordance with techniques disclosed herein. Other logical flows can be implemented using the circuits described herein and the logic disclosed herein is provided for illustrative purposes and is not to be construed as limiting. The logical flows described herein can be implemented utilizing the circuits of FIGS. 4A and 4B or other circuits that provide similar functionality.

The above specification, examples and data provide a complete description of the manufacture and use of the composition of the invention. Since many embodiments of the invention can be made without departing from the spirit and scope of the invention, the invention resides in the claims hereinafter appended.

The disclosure presented herein encompasses the subject matter set forth in the following clauses.

Clause A: A system comprising: a laser diode for illuminating a rendering of content of video data on a display screen, the laser diode comprising an anode and a cathode; a current source comprising an input and an output, the output of the current source coupled to the anode of the laser diode; a first voltage source comprising an input and an output, the output of the first voltage source coupled to the input of the current source, the input of the first voltage source coupled to a ground nod, the first voltage source generating a positive supply voltage driving the input of the current source; a second voltage source comprising an input and an output, the output of the second voltage source coupled to the cathode of the laser diode, the input of the second voltage source coupled to the ground node, the second voltage source generating a negative supply voltage to provide sufficient compliance for the laser diode to emit light; a voltage sensor having in input coupled to the anode of the laser diode, the voltage sensor monitoring a voltage between the anode of the laser diode and the ground node; and a controller coupled to a control input of the second voltage source and an output of the voltage sensor, the controller causing the voltage sensor to determine peak voltage readings at the anode of the laser diode at a predetermined sample rate, wherein the controller causes the second voltage source to adjust the negative supply voltage in response to a detection of new peak voltage reading to avoid saturation of the laser diode.

Clause B: The system of Clause A, wherein the predetermined sample rate is at or higher than a frame rate of the video data.

Clause C: The system of Clauses A and B, wherein the video data includes histogram data indicating an intensity level of one or more video properties comprising at least one of a contrast level, a brightness level, or a color intensity level, wherein the controller causes the second voltage source to adjust the negative supply voltage in response to a detection of an increased intensity level of the one or more video properties.

Clause D: The system of Clauses A through C, wherein an analysis of the histogram data applies to pre-fetched frames of video data for enabling the adjustment to the negative supply voltage prior to the frames that include the increased intensity level of the one or more video properties.

Clause E: The system of Clauses A through D, wherein the controller receives an input data for adjusting a brightness of the rendering, where an increase in brightness causes the causes the second voltage source to adjust the negative supply voltage to a lower voltage level, and wherein a decrease in brightness causes the causes the second voltage source to adjust the negative supply voltage to a higher voltage level.

Clause F: The system of Clauses A through E, further comprising: analyzing two samples of the voltage at the anode of the laser diode to determine a slope; determining a junction temperature of the laser diode based on the slope; and adjusting the negative supply voltage based on the junction temperature of the laser diode.

Clause G: The system of Clauses A through F, wherein the controller receives calibration data defining operating characteristic curves for the laser diode at multiple operating temperatures and the calibration data is utilized by the controller in determining the junction temperature of the laser diode based on the slope.

Clause H: The system of Clauses A through G, wherein the controller determines voltage rails, the voltage rails comprising the output of the first voltage source and the output of the second voltage source, wherein the drive current of the current source is adjusted to below laser diode threshold during a blanking period of the optical output and so the laser diode does not actively emit light, estimate the junction temperature of the laser diode during the blanking period, and updating the calibration data during the blanking period.

Clause I: A system for controlling a laser diode, the system comprising: a first voltage source coupled to a first supply rail and configured to generate a first supply voltage; a second voltage source coupled to a second supply rail and having a control input, where the second voltage source is configured to generate a second supply voltage, where a voltage level of the second supply voltage is determined by a control signal at the control input of the second voltage source, and where the system is configured for the second supply rail to be coupled to a cathode of the laser diode; a current source having an input and an output, where the input of the current source is coupled to the first supply rail, the current source is configured to generate an operating current at the output of the current source, and the system is configured for the output of the current source to be coupled to an anode of the laser diode; a voltage sensor having an input and an output, where the system is configured for the input of the voltage sensor to be coupled to the anode of the laser diode; and a controller having a first input and an output, where the first input of the controller is coupled to the output of the voltage sensor, the output of the controller is coupled to the control input of the second voltage source, and the controller is configured to: measure a first measured voltage level of an operating voltage at the anode of the laser diode sensed by the voltage sensor, determine a junction operating temperature of the laser diode based on a first current level of the operating current and the first measured voltage level of the operating voltage, and generate a control signal at the output of the controller that adjusts the voltage level of the second supply voltage based on an operating characteristic curve corresponding to the junction operating temperature.

Clause J: The system of Clause I, where the controller is configured to: measure a second measured voltage level of the operating voltage at the anode of the laser diode sensed by the voltage sensor at a second current level of the operating current; and determine the operating temperature of the laser diode based on a slope between a first operating point at the first voltage level and first current level and a second operating point at the second voltage level and the second current level.

Clause K: The system of Clause I through J: where the controller is configured to adjust the voltage level of the second supply voltage to prevent saturation of the laser diode.

Clause L: The system of Clause I through K: where the controller is configured to adjust the voltage level of the second supply voltage to reduce power consumption by the laser diode.

Clause M: The system of Clause I through L: where the controller includes a second input configured to receive a content signal corresponding to display data to be rendered by the laser diode and the controller is configured to adjust the control signal at the output of the controller based on the content signal received by the controller.

Clause N: The system of Clause I through M: wherein the controller samples the operating voltage at a sample rate that is at or higher than a frame rate of the display data.

Clause O: The system of Clause I through N: wherein the content data includes histogram data indicating an intensity level of one or more video properties of the display data comprising at least one of a contrast level, a brightness level, or a color intensity level, wherein the controller generates the control signal at the output of the controller to adjust the voltage level of the second supply voltage in response to a detection of a change in intensity level of the one or more video properties.

Clause P: The system of Clause I through O: wherein the histogram data applies to pre-fetched frames of display data to enabling the adjustment to the voltage level of the second supply voltage prior to the frames that include the changed intensity level of the one or more video properties.

Clause Q: The system of Clause I through P: wherein the controller receives a brightness control signal that causes the controller to generate the control signal at the output of the controller to adjust the voltage level of the second supply voltage to change a brightness level of the laser diode.

Clause R: A method for controlling a Light Emitting Diode (LED), the method comprising: generating a first supply voltage; generating a second supply voltage, where a voltage level of the second supply voltage is variable and the second supply voltage is applied to a cathode of the LED; generating an operating current that is applied to an anode of the LED; monitoring an output voltage at the anode of the LED; detecting one or more peaks in the output voltage at the anode of the LED at a predetermined sample rate; and adjusting the voltage level of the second supply voltage in response to a detection of a new peak voltage reading to avoid saturation of the LED.

Clause S: The method of Clause R, the method comprising: measuring a first measured voltage level of the output voltage at the anode of the LED at a first current level of the operating current; determining a junction operating temperature of the LED based on the first current level of the operating current and the first measured voltage level of the output voltage; and adjusting the voltage level of the second supply voltage based on an operating characteristic curve corresponding to the junction operating temperature.

Clause T: The method of Clauses R through S, the method comprising: receiving content activity data indicating an intensity level of one or more video properties of video display data to be rendered by the LED comprising at least one of a contrast level, a brightness level, or a color intensity level; and adjusting the voltage level of the second supply voltage based on the intensity level of the one or more video properties.

What is claimed is:

1. A system comprising:

a laser diode for illuminating a rendering of content of video data on a display screen, the laser diode comprising an anode and a cathode;

a current source comprising an input and an output, the output of the current source coupled to the anode of the laser diode;

a first voltage source comprising an input and an output, the output of the first voltage source coupled to the input of the current source, the input of the first voltage source coupled to a ground node, the first voltage source generating a positive supply voltage driving the input of the current source;

a second voltage source comprising an input and an output, the output of the second voltage source coupled to the cathode of the laser diode, the input of the second voltage source coupled to the ground node, the second voltage source generating a negative supply voltage to provide sufficient compliance for the laser diode to emit light;

a voltage sensor having an input coupled to the anode of the laser diode, the voltage sensor monitoring a voltage between the anode of the laser diode and the ground node; and a controller coupled to a control input of the second voltage source and an output of the voltage sensor, the controller causing the voltage sensor to determine peak voltage readings at the anode of the laser diode at a predetermined sample rate, wherein the controller causes the second voltage source to adjust the negative supply voltage in response to a detection of new peak voltage reading to avoid saturation of the laser diode.

2. The system of claim 1, wherein the predetermined sample rate is at or higher than a frame rate of the video data.

3. The system of claim 1, wherein the video data includes histogram data indicating an intensity level of one or more video properties comprising at least one of a contrast level, a brightness level, or a color intensity level, wherein the controller causes the second voltage source to adjust the negative supply voltage in response to a detection of an increased intensity level of the one or more video properties.

4. The system of claim 3, wherein an analysis of the histogram data applies to pre-fetched frames of video data for enabling the adjustment to the negative supply voltage prior to the frames that include the increased intensity level of the one or more video properties.

5. The system of claim 1, wherein the controller receives an input data for adjusting a brightness of the rendering, where an increase in brightness causes the second voltage source to adjust the negative supply voltage to a lower voltage level, and wherein a decrease in brightness causes the second voltage source to adjust the negative supply voltage to a higher voltage level.

6. The system of claim 1, further comprising:

analyzing two samples of the voltage at the anode of the laser diode to determine a slope;

determining a junction temperature of the laser diode based on the slope; and adjusting the negative supply voltage based on the junction temperature of the laser diode.

7. The system of claim 6, wherein the controller receives calibration data defining operating characteristic curves for the laser diode at multiple operating temperatures and the calibration data is utilized by the controller in determining the junction temperature of the laser diode based on the slope.

8. The system of claim 7, wherein the controller determines voltage rails, the voltage rails comprising the output of the first voltage source and the output of the second voltage source, wherein the drive current of the current source is adjusted to below laser diode threshold during a blanking period of the optical output and so the laser diode does not actively emit light, estimate the junction temperature of the laser diode during the blanking period, and updating the calibration data during the blanking period.

9. A system for controlling a laser diode, the system comprising:

a first voltage source coupled to a first supply rail and configured to generate a first supply voltage;

a second voltage source coupled to a second supply rail and having a control input, where the second voltage source is configured to generate a second supply voltage, where a voltage level of the second supply voltage is determined by a control signal at the control input of the second voltage source, and where the system is configured for the second supply rail to be coupled to a cathode of the laser diode;

a current source having an input and an output, where the input of the current source is coupled to the first supply rail, the current source is configured to generate an operating current at the output of the current source, and the system is configured for the output of the current source to be coupled to an anode of the laser diode;

a voltage sensor having an input and an output, where the system is configured for the input of the voltage sensor to be coupled to the anode of the laser diode; and a controller having a first input and an output, where the first input of the controller is coupled to the output of the voltage sensor, the output of the controller is coupled to the control input of the second voltage source, and the controller is configured to:

measure a first measured voltage level of an operating voltage at the anode of the laser diode sensed by the voltage sensor, determine a junction operating temperature of the laser diode based on a first current level of the operating current and the first measured voltage level of the operating voltage, and generate a control signal at the output of the controller that adjusts the voltage level of the second supply voltage based on an operating characteristic curve corresponding to the junction operating temperature.

10. The system of claim 9, where the controller is configured to:

measure a second measured voltage level of the operating voltage at the anode of the laser diode sensed by the voltage sensor at a second current level of the operating current; and determine the operating temperature of the laser diode based on a slope between a first operating point at the first voltage level and first current level and a second operating point at the second voltage level and the second current level.

11. The system of claim 9, where the controller is configured to adjust the voltage level of the second supply voltage to prevent saturation of the laser diode.

12. The system of claim 11, where the controller is configured to adjust the voltage level of the second supply voltage to reduce power consumption by the laser diode.

13. The system of claim 9, where the controller includes a second input configured to receive a content signal corresponding to display data to be rendered by the laser diode and the controller is configured to adjust the control signal at the output of the controller based on the content signal received by the controller.

14. The system of claim 13, wherein the controller samples the operating voltage at a sample rate that is at or higher than a frame rate of the display data.

15. The system of claim 13, wherein the content data includes histogram data indicating an intensity level of one or more video properties of the display data comprising at least one of a contrast level, a brightness level, or a color intensity level, wherein the controller generates the control signal at the output of the controller to adjust the voltage level of the second supply voltage in response to a detection of a change in intensity level of the one or more video properties.

16. The system of claim 15, wherein the histogram data applies to pre-fetched frames of display data to enable the adjustment to the voltage level of the second supply voltage prior to the frames that include the changed intensity level of the one or more video properties.

17. The system of claim 9, wherein the controller receives a brightness control signal that causes the controller to generate the control signal at the output of the controller to adjust the voltage level of the second supply voltage to change a brightness level of the laser diode.

18. A method for controlling a Light Emitting Diode (LED) for illuminating a rendering of content of video data on a display screen, the LED comprising an anode and a cathode, the method comprising:

generating a first supply voltage at an input of a first current source comprising a current output coupled to the anode of the LED, wherein the first supply voltage is generated by a first voltage source comprising an input coupled to a ground node;

generating a second supply voltage at the cathode of the LED, wherein the second supply voltage is generated by a second voltage source comprising an input coupled to the ground node, wherein a voltage level of the second supply voltage is variable and the second supply voltage is applied to the cathode of the LED;

generating an operating current that is applied to the anode of the LED;

monitoring an output voltage at the anode of the LED;

detecting one or more peaks in the output voltage at the anode of the LED at a predetermined sample rate; and adjusting the voltage level of the second supply voltage in response to a detection of a new peak voltage reading to avoid saturation of the LED, wherein the second supply voltage is a negative supply voltage to provide sufficient compliance for the LED to emit light.

19. The method of claim 18, the method comprising:

measuring a first measured voltage level of the output voltage at the anode of the LED at a first current level of the operating current;

determining a junction operating temperature of the LED based on the first current level of the operating current and the first measured voltage level of the output voltage; and adjusting the voltage level of the second supply voltage based on an operating characteristic curve corresponding to the junction operating temperature.

20. The method of claim 18, the method comprising:

receiving content activity data indicating an intensity level of one or more video properties of video display data to be rendered by the LED comprising at least one of a contrast level, a brightness level, or a color intensity level; and adjusting the voltage level of the second supply voltage based on the intensity level of the one or more video properties.

* * * * *